(12) United States Patent
Lin

(10) Patent No.: US 7,443,637 B2
(45) Date of Patent: Oct. 28, 2008

(54) GIANT MAGNETORESISTANCE SENSOR WITH SIDE LONGITUDINAL BIAS STACKS AND METHOD FOR FORMING SAME

(75) Inventor: Tsann Lin, Saratoga, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 291 days.

(21) Appl. No.: 11/179,084

(22) Filed: Jul. 11, 2005

(65) Prior Publication Data

US 2007/0008762 A1 Jan. 11, 2007

(51) Int. Cl.
G11B 5/39 (2006.01)
(52) U.S. Cl. .................................. 360/324.11
(58) Field of Classification Search ............ 360/324.11, 360/324.12, 327.1, 327.2, 327.22, 327.3, 360/327.32, 324.2, 319, 314; 29/603.07, 29/603.1; 428/611
See application file for complete search history.

(56) References Cited

U.S. PATENT DOCUMENTS

| 6,292,336 | B1 * | 9/2001 | Horng et al. | ........... 360/324.12 |
| 6,338,899 | B1 * | 1/2002 | Fukuzawa et al. | ...... 360/324.12 |
| 6,344,954 | B1 * | 2/2002 | Redon et al. | ............. 360/324.2 |
| 6,430,015 | B2 * | 8/2002 | Ju et al. | .................. 360/327.32 |
| 6,462,919 | B1 * | 10/2002 | Mack et al. | .............. 360/327.3 |
| 6,567,247 | B1 * | 5/2003 | Araki et al. | ............ 360/324.12 |
| 6,735,058 | B2 * | 5/2004 | Lin et al. | ..................... 360/319 |
| 6,857,180 | B2 * | 2/2005 | Horng et al. | ............. 29/603.14 |
| 6,893,734 | B2 * | 5/2005 | Hasegawa et al. | .......... 428/611 |
| 6,961,225 | B2 * | 11/2005 | Gill | ....................... 360/324.12 |
| 2002/0159205 | A1 | 10/2002 | Kula et al. | ............. 360/324.11 |
| 2003/0133233 | A1 * | 7/2003 | Gill | ....................... 360/324.12 |
| 2003/0167625 | A1 * | 9/2003 | Li et al. | .................. 29/603.07 |
| 2003/0179515 | A1 * | 9/2003 | Pinarbasi | ............... 360/324.11 |
| 2003/0179517 | A1 | 9/2003 | Horng et al. | ........... 360/324.12 |
| 2003/0189798 | A1 | 10/2003 | Lin et al. | ..................... 360/322 |
| 2004/0061982 | A1 | 4/2004 | Lin et al. | ................. 360/324.1 |
| 2004/0145835 | A1 * | 7/2004 | Gill | ............................ 360/314 |
| 2004/0165320 | A1 | 8/2004 | Carey et al. | ............ 360/324.11 |
| 2005/0241138 | A1 * | 11/2005 | Dill et al. | ................. 29/603.01 |

* cited by examiner

*Primary Examiner*—Tianjie Chen
(74) *Attorney, Agent, or Firm*—Zilka-Kotab, PC

(57) ABSTRACT

A giant magnetoresistance (GMR) sensor with side longitudinal bias (LB) stacks is proposed for magnetic recording at ultrahigh densities. The GMR sensor extends from a read region into two side regions. The side LB stacks overlies the GMR sensor in the two side regions, rigidly pinning sense layers through antiparallel coupling across an antiparallel coupling spacer layer. Magnetostatic interactions occur in the sense layers between the read and side regions, thereby stabilizing the sense layers in the read region.

15 Claims, 6 Drawing Sheets

GIANT MAGNETORESISTANCE SENSOR WITH SIDE LONGITUDINAL BIAS STACKS AND METHOD FOR FORMING SAME

FIELD OF THE INVENTION

The present invention relates to an assembly of write and read heads used for magnetic recording at ultrahigh densities in a data storage system, and more particularly to a giant magnetoresistance (GMR) sensor overlaid with side longitudinal bias stacks in two side regions of the read head.

BACKGROUND OF THE INVENTION

The heart of a computer is a magnetic disk drive which includes a rotating magnetic disk, a slider that has an assembly of write and read heads, a suspension arm above the rotating magnetic disk, and an actuator arm that swings the suspension arm to place the assembly of write and read heads over selected circular tracks on the rotating magnetic disk. When the magnetic disk is stationary, the suspension arm biases the slider into contact with the surface of the magnetic disk. When the magnetic disk rotates, air is swirled by the rotating magnetic disk, causing the slider to ride on an air bearing a slight distance from the surface of the rotating magnetic disk. When the slider rides on the air bearing, the assembly of write and read heads is employed for writing magnetic impressions to and reading magnetic signal fields from the rotating magnetic disk. The assembly of write and read heads is connected to processing circuitry that operates according to a computer program to implement the write and read functions.

A commonly used write head includes first and second write-pole layers, a write-gap layer, a coil layer, and first, second and third insulation layers. The write-gap, coil and insulation layers are sandwiched between the first and second write-pole layers. The first and second write-pole layers are connected at the back of the write head. Current conducted to the coil layer induces a magnetic flux in the first and second write-pole layers which cause a magnetic field to fringe out at the air bearing surface of the write head for the purpose of writing the aforementioned magnetic impressions in circular tracks on the aforementioned rotating magnetic disk.

A commonly used read head 100, as shown in FIG. 1, includes Ni—Fe first and second shield layers 102, 104, $Al_2O_3$ first and second read-gap layers 106, 108, a giant magnetoresistance (GMR) sensor 110 in a read region, and side longitudinal bias (LB) stacks 130 in two side regions. The GMR sensor 110 and the side longitudinal bias stacks 130 are sandwiched between the first ad second read-gap layers 106, 108, which are in turn sandwiched between the first and second shield layers 102, 104. The GMR sensor 110 typically comprises Al—O/Ni—Cr—Fe/Ni—Fe seed layers 112, an antiferromagnetic Pt—Mn transverse pinning layer 114, a transverse flux-closure structure 116 (comprising a ferromagnetic Co—Fe keeper layer 118, a nonmagnetic Ru spacer layer 120, and a ferromagnetic Co—Fe reference layer 122), a nonmagnetic conducting Cu—O spacer layer 124, ferromagnetic Co—Fe/Ni—Fe sense layers 126, and a nonmagnetic Ta cap layer 128.

The side LB stack 130 typically comprises a nonmagnetic Cr seed layer 132, a hard-magnetic Co—Pt—Cr longitudinal bias layer 134, and a nonmagnetic Rh conductor layer 136.

In the prior-art fabrication process of the read head 100, the GMR sensor 110 comprising Al—O(3)/Ni—Cr—Fe(3.2)/Ni—Fe(0.4)/Pt—Mn(15)/Co—Fe(1.6)/Ru(0.8)/Co—Fe(1.6)/Cu—O(1.8)/Co—Fe(1)/Ni—Fe(1.6)/Ta(4) films (thickness in nm) is deposited in a deposition field of 100 Oe on a 8.2 nm thick $Al_2O_3$ first read-gap layer 102. A transverse-field anneal is applied in a field of 50,000 Oe for 5 hours at 265° C. in a transverse direction perpendicular to the deposition field. A monolayer photoresist is then applied and patterned in a photolithographic tool to mask the GMR sensor 110 in a read region. Ion milling is applied to entirely remove the GMR sensor 110 and partially remove the $Al_2O_3$ first read-gap layer 106 in the exposed side regions, in order to form sharp contiguous junctions at the read and side regions. The longitudinal bias stack 130, comprising the Cr(15) seed layer 132, the Co—Pt—Cr(10) longitudinal bias layer 134 and the Rh(45) conductor layer 136, is then deposited preferably with ion beam sputtering at a normal angle for abutting the GMR sensor 110 at the sharp contiguous junctions. The monolayer photoresist is lifted off, with assistance of chemical mechanical polishing (CMP), and the $Al_2O_3$(8.2) second read-gap layer 104 is then deposited.

The GMR sensor 110 requires the transverse-field anneal to develop strong antiferromagnetic/ferromagnetic coupling between the Pt—Mn transverse pinning layer 114 and the transverse flux-closure structure 116. The anneal field must exceed the saturation field ($H_S$) of antiparallel ferromagnetic/ferromagnetic coupling across the Ru spacer layer 120 (~8,000 Oe) for aligning the magnetizations of the Co—Fe keeper and reference layers 118, 122 in the transverse direction. After cooling to room temperature, the magnetization of the Co—Fe keeper layer 118 is rigidly pinned by the Pt—Mn transverse pinning layer 114 in the transverse direction, while the magnetization of the Co—Fe reference layer 122 is rotated by 180°. A transverse flux closure will be formed between the magnetization of the Co—Fe keeper and reference layers 118, 112 after patterning and lapping, resulting in a small net magnetic moment in the transverse flux-closure structure 116. This small magnetic moment induces a small demagnetizing field ($H_D$) in the Co—Fe/Ni—Fe sense layers 126.

In the GMR sensor 110, antiferromagnetic/ferromagnetic coupling occurs between the Pt—Mn transverse pinning layer 114 and the Co—Fe/Ru/Co—Fe transverse flux-closure structure 116, producing a pinning field ($H_P$). This $H_P$ must be high enough to rigidly pin the net magnetization of the Co—Fe/Ru/Co—Fe transverse flux-closure structure 116 in a transverse direction perpendicular to the ABS for proper sensor operation. Ferromagnetic/ferromagnetic coupling also occurs across the Cu—O spacer layer 124, producing a negative ferromagnetic coupling field ($H_F$). This $H_F$ must be precisely controlled so that the sum of $H_F$ and $H_D$ counterbalances a current-induced field ($H_1$) in the Co—Fe/Ni—Fe sense layer 126 ($H_F+H_D=H_1$), thereby orienting the magnetization of the Co—Fe/Ni—Fe sense layers 126 in a longitudinal direction parallel to the ABS for optimally biased sensor operation.

During sensor operation, only the magnetization of the Co—Fe/Ni—Fe sense layers 126 is free to rotate in positive and negative directions from a quiescent state in response to positive and negative magnetic signal fields from the adjacent rotating magnetic disk. This rotation causes changes in scattering of conduction electrons at interfaces of the Cu—O spacer layer 124 with the sense and reference layers 126, 122, thereby causing changes in the resistance of the GMR sensor 110 in proportion to cos θ, where θ is an angle between the magnetizations of the sense and reference layers 126, 122. The changes in the resistance of the GMR sensor 110 cause potential changes that are detected and processed as playback signals.

There are several disadvantages in the use of the GMR sensor 110 with the hard magnetic stabilization scheme as described in the prior art. First, to attain stable GMR responses, the Cr seed layer 132 in the side regions must be thick enough to align the midplane of the Co—Pt—Cr longitudinal bias layer 134 with that of the Co—Fe/Ni—Fe sense layers 126 of the GMR sensor 110. However, the Cr seed layer 132 at the contiguous junctions is thus inevitably thick, causing substantial separation between the sense layers 126 and the Co—Pt—Cr longitudinal bias layer 134, and significantly reducing stabilization efficiency. Second, the Rh conductor layer 136 must be thick enough to provide a low-resistance path. As a result, substantial overhangs at sides of the monolayer photoresist are formed, causing difficulties in the liftoff process. Third, the CMP that is typically applied to facilitate the liftoff process may cause mechanical and magnetic damages to the GMR sensor 110. Fourth, in this hard magnetic stabilization scheme, longitudinal bias fields provided by the Co—Pt—Cr longitudinal bias layer 134 are high at edges of the Co—Fe/Ni—Fe sense layers 126, causing difficulties in rotating the magnetization of the Co—Fe/Ni—Fe sense layers 126, but are low at the center of the Co—Fe/Ni—Fe sense layers 126, causing difficulties in stabilizing the Co—Fe/Ni—Fe sense layers 126. To eliminate these disadvantages, a novel antiferromagnetic stabilization scheme is proposed in this invention.

SUMMARY OF THE INVENTION

A giant magnetoresistance (GMR) sensor with side longitudinal bias (LB) stacks is proposed for magnetic recording at ultrahigh densities in a data storage system. The GMR sensor extends from a read region into two side regions. The side LB stacks, comprising an antiparallel-coupling spacer layer, a ferromagnetic longitudinal bias layer, an antiferromagnetic longitudinal pinning layer, and a nonmagnetic cap layer, overlie the GMR sensor in the two side regions. Antiparallel exchange-coupling occurs across the antiparallel-coupling spacer layer, thus creating a longitudinal bias field and rigidly pinning the sense layers of the GMR sensor. Magnetostatic interactions also occur in the sense layers between the read and side regions, thereby stabilizing the sense layers in the read region.

The transverse pinning layer of the GMR sensor is preferably made of either a Pt—Mn or Ir—Mn—Cr film, while the longitudinal pinning layer of the side LB stack is preferably made of an Ir—Mn—Cr film. Two anneals are applied in the fabrication processes of the read head, one for the formation of a transverse flux closure and the other for the creation of the longitudinal bias field. A method of optimizing the longitudinal bias field is also proposed.

Other aspects and advantages of the present invention will become apparent from the following detailed description, which, when taken in conjunction with the drawings, illustrate by way of example the principles of the invention.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

BEST MODE FOR CARRYING OUT THE INVENTION

The following description is the best embodiment presently contemplated for carrying out the present invention. This description is made for the purpose of illustrating the general principles of the present invention and is not meant to limit the inventive concepts claimed herein.

Figure 1:
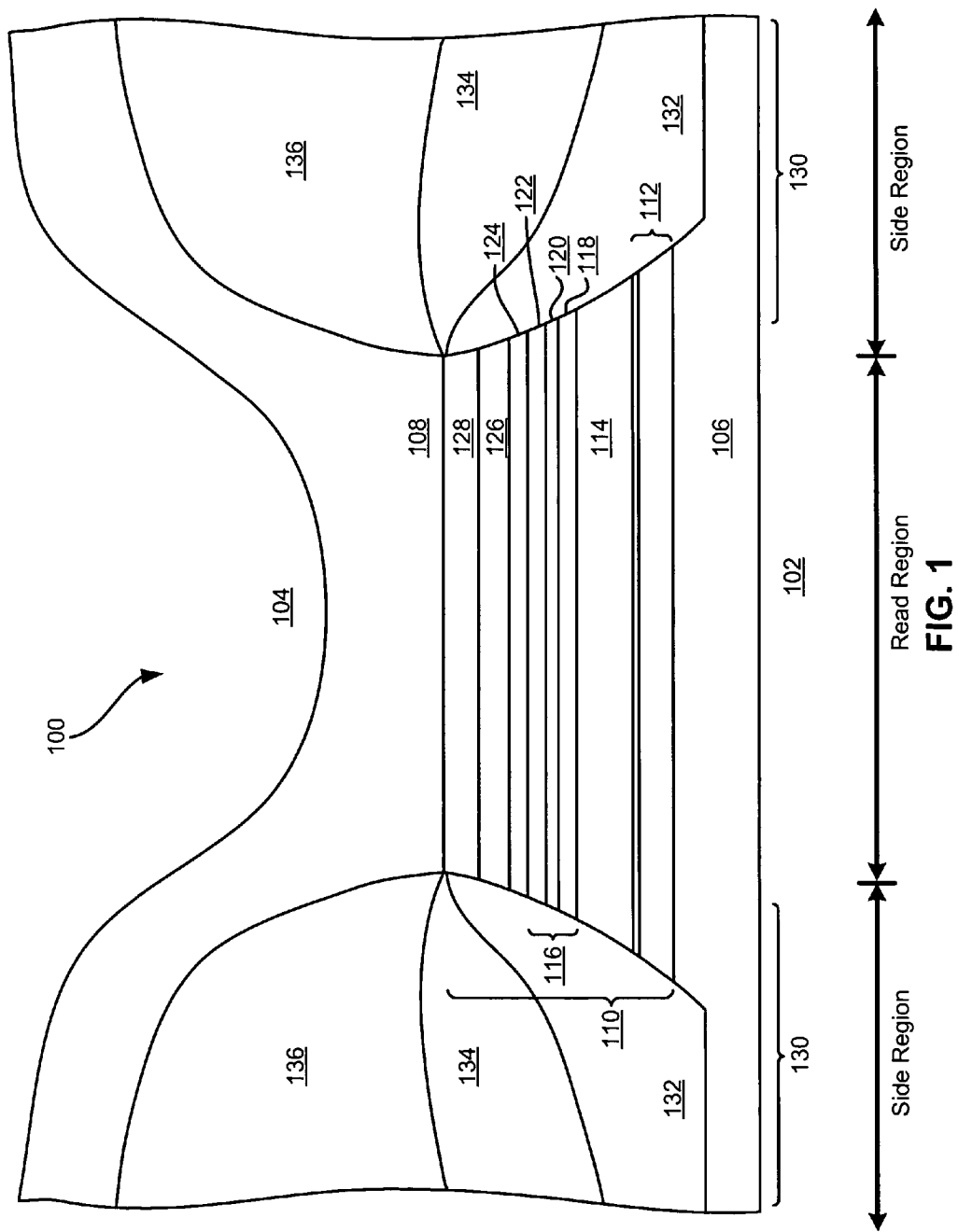
FIG. 1 is an ABS view, not to scale, of a prior art read head.
Figure 2:
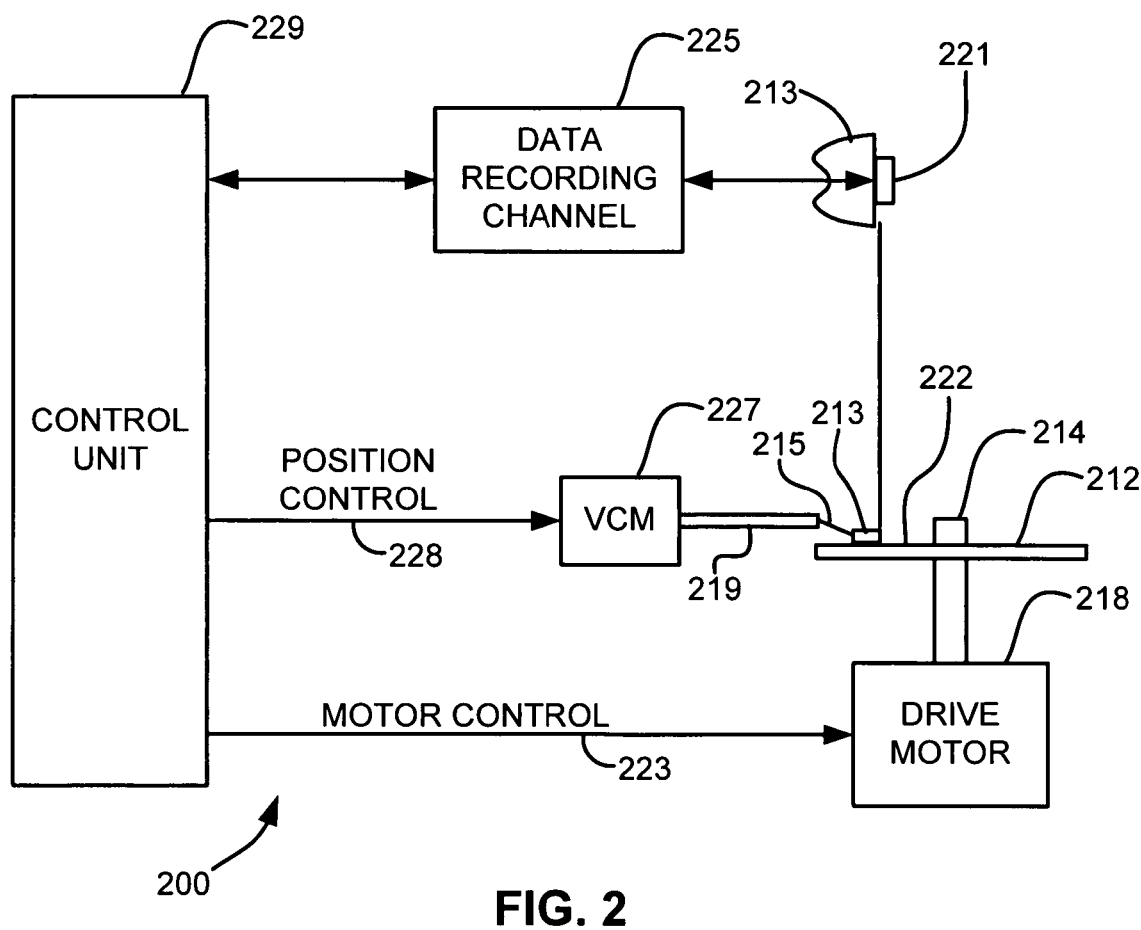
FIG. 2 is a simplified drawing of a data storage system wherein the invention is embodied.

Referring now to FIG. 2, there is shown a disk drive 200 embodying the present invention. As shown in FIG. 2, at least one rotatable magnetic disk 212 is supported on a spindle 214 and rotated by a disk drive motor 218. The magnetic recording on each magnetic disk 212 is in the form of an annular pattern of concentric data tracks (not shown) on the magnetic disk 212.

At least one slider 213 is positioned near the magnetic disk 212, each slider 213 supporting one or more assemblies of write and read heads 221. More information regarding such assemblies of write and read heads 221 will be set forth hereinafter. As the magnetic disk 212 rotates, the slider 213 is moved radially in and out over the disk surface 222 so that the assembly of write and read heads 221 may access different tracks of the magnetic disk 212 where desired data are recorded. Each slider 213 is attached to an actuator arm 219 by means of a suspension 215. The suspension 215 provides a slight spring force which biases slider 213 against the disk surface 222. Each actuator arm 219 is attached to an actuator means 227. The actuator means 227 as shown in FIG. 2 may be a voice coil motor (VCM). The VCM comprises a coil movable within a fixed magnetic field, the direction and speed of the coil movements being controlled by the motor current signals supplied by a control unit 229.

During operation of the data storage system 200, the rotation of the magnetic disk 212 generates an air bearing between the slider 213 and the disk surface 222 which exerts an upward force or lift on the slider 213. The air bearing thus counter-balances the slight spring force of the suspension 215 and supports the slider 213 off and slightly above the disk surface 222 by a small, substantially constant spacing during normal operation.

The various components of the data storage system 200 are controlled in operation by control signals generated by the control unit 229, such as access control signals and internal clock signals. Typically, the control unit 229 comprises logic control circuits, storage means and a microprocessor. The control unit 229 generates control signals to control various system operations such as drive motor control signals on line 223 and head position and seek control signals on line 228. The control signals on line 228 provide the desired current profiles to optimally move and position the slider 213 to the desired data track on the magnetic disk 212. Write and read signals are communicated to and from the assembly of write and read heads 221 by way of a recording channel 225.

The above description of the typical data storage system and the accompanying illustration of FIG. 2 are for representation purposes only. It should be apparent that data storage systems may contain a large number of magnetic disks and actuators, and each actuator may support a number of sliders.

Figure 3:
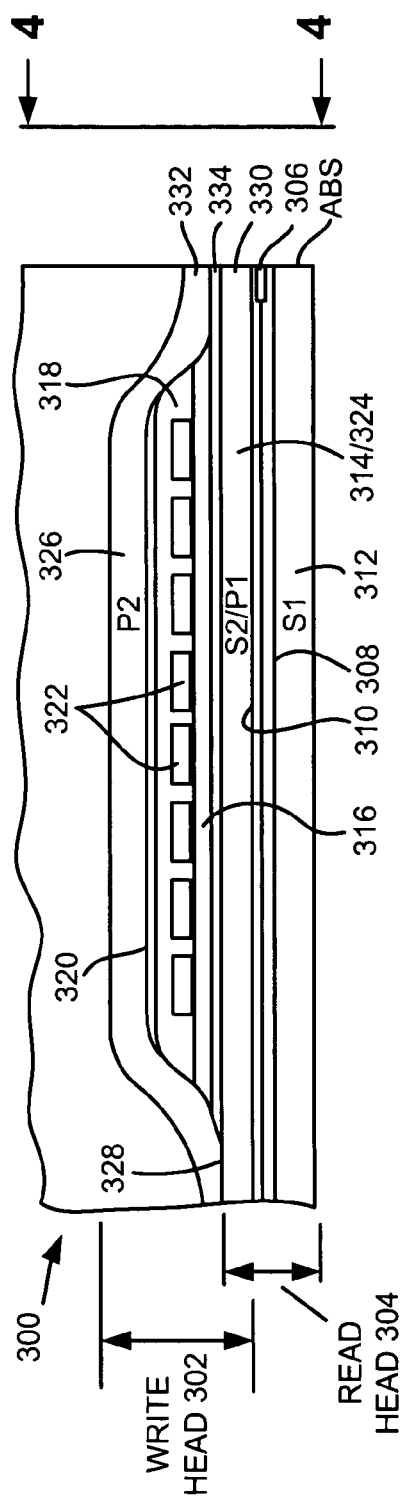
FIG. 3 is a cross-sectional elevation view, not to scale, of an assembly of write and read heads
Figure 4:
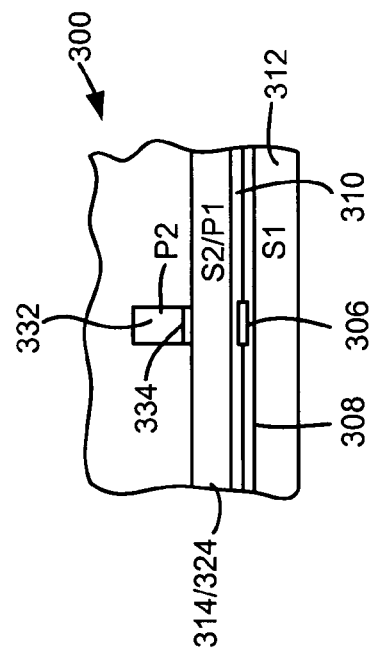
FIG. 4 is an ABS view, not to scale, of an assembly of write and read heads taken along plane 4-4 of FIG. 3.

FIG. 3 is a side cross-sectional elevation view of an assembly of write and read heads 300, which includes a write head 302 and a read head 304 wherein the GMR sensor 306 of the present invention is employed. FIG. 4 is an ABS view of FIG. 3.

The write head 302 includes first and second write-pole layers 324 and 326, a coil layer 322, and first, second and third insulation layers 316, 318, 320. The coil layer 322 is sandwiched between the first and second insulation layers 316, 318. A third insulation layer 320 may be employed to eliminate ripples in the second insulation layer 318 caused by the coil layer 322, thereby planarizing the second write-pole layer 326. The first, second and third insulation layers 316, 318, 320 are referred to in the art as an "insulation stack". The coil layer 322 and the first, second and third insulation layers 316, 318, 320 are sandwiched between the first and second write-pole layers 324, 326. The first and second write-pole layers 324, 326 are magnetically coupled at a back gap 328 and have first and second write-pole tips 330, 332 which are separated by a write-gap layer 334 at the ABS.

In the read head 304, the GMR sensor 306 is sandwiched between first and second nonmagnetic electrically insulating read-gap layers 308, 310, which are in turn sandwiched between first and second ferromagnetic shield layers 312 and 314. In response to external magnetic fields, the resistance of the GMR sensor 306 changes. A sense current conducted through the GMR sensor 306 causes these resistance changes to be manifested as potential changes. These potential changes are then processed as readback signals by the processing circuitry 229 as shown in FIG. 2.

In this assembly of write and read heads 300, the first write-pole layer 324 and the second shield layer 314 are a common layer. Alternatively, the first write-pole layer 324 and the second shield layer 314 may be separated by a nonmagnetic electrically insulating separation layer.

Figure 5:
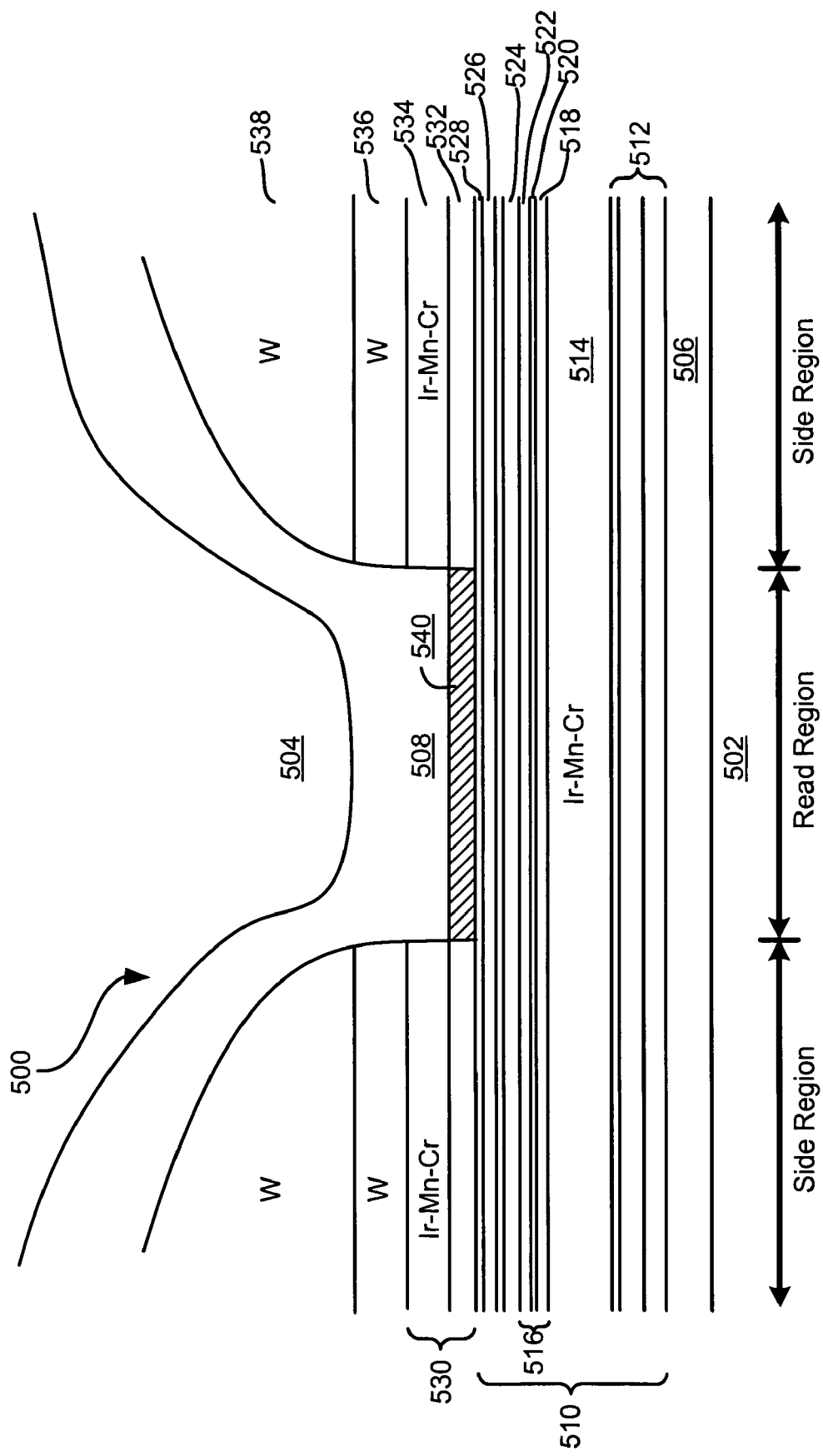
FIG. 5 is an ABS view, not to scale, of a read head according to one embodiment of the invention.

FIG. 5 illustrates an exemplary read head 500 in accordance with one embodiment of the present invention. The read head 500 includes first and second shield layers 502, 504 (e.g., of Ni—Fe), first and second read-gap layers 506, 508 (e.g., of $Al_2O_3$), a MR sensor 510 extending from a read region into two side regions, and side LB stacks 530 in the two side regions. The GMR sensor 510 and the side LB stacks 530 are sandwiched between the first and second read-gap layers 506, 508, which are in turn sandwiched between the first and second shield layers 502, 504.

The sensor 510 can have any suitable composition and construction, and can be a MR sensor, a GMR sensor, etc. A GMR sensor 510 according to a preferred embodiment of the present invention comprises seed layers 512 (e.g., of Al—O/Ni—Cr—Fe/Ni—Fe), an antiferromagnetic transverse pinning layer 514 (e.g., of Ir—Mn—Cr), a transverse flux-closure structure 516 [comprising a ferromagnetic keeper layer 518 (e.g., of Co—Fe), a nonmagnetic spacer layer 520 (e.g., of Ru), and a ferromagnetic reference layer 522 (e.g., of Co—Fe)], a nonmagnetic conducting spacer layer 524 (e.g., of Cu—O), ferromagnetic sense layers 526 (e.g., of Co—Fe/Ni—Fe), and a nonmagnetic cap layer 528 (e.g., of Ru). The side LB stack 530 comprises an antiparallel coupling spacer layer 528 (e.g., of Ru), a ferromagnetic longitudinal bias layer 532 (e.g., of Co—Fe), and an antiferromagnetic longitudinal pinning layer 534 (e.g., of Ir—Mn—Cr). A nonmagnetic conductor layer 536 (e.g., of W, Rh, etc.) is formed above each longitudinal pinning layer. Another nonmagnetic conductor layer 538 (e.g., of W, Rh, etc.) is present over the first conductor layer 536. This second conductor layer 538 functions as a lead. As will be described in more detail below, the nonmagnetic conductor layer 536 initially functions as a cap, then becomes part of a lead structure that encompasses both conductor layers 536, 538.

Again, it should be kept in mind that the structures described herein are presented by way of example only, and one skilled in the art will appreciate that other materials can be used to form the GMR sensor or head, and that layers can be added or removed per design considerations.

Figure 6:
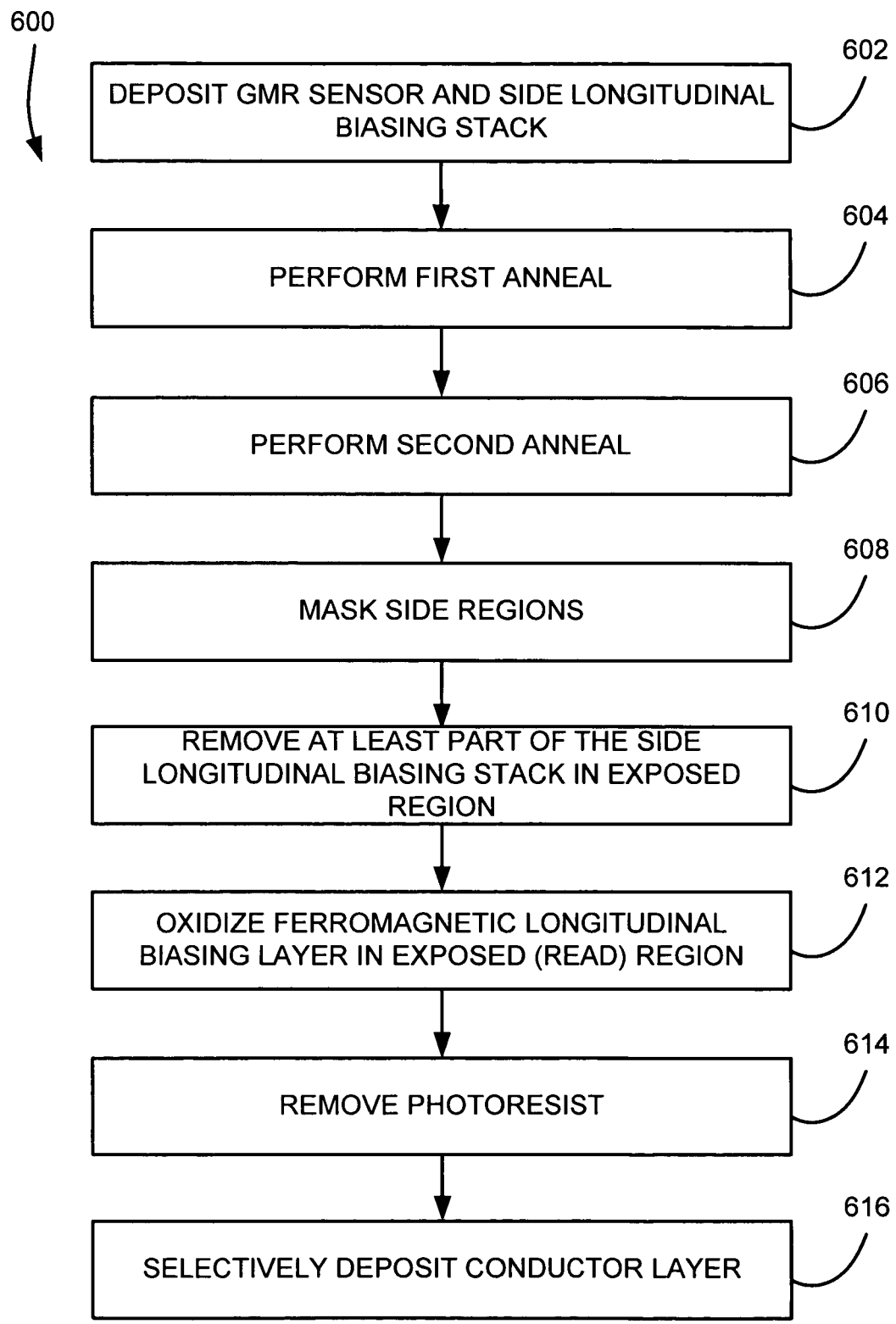
FIG. 6 is a process diagram of a process for fabricating a GMR sensor with side LB stacks according to one embodiment of the invention.

FIG. 6 depicts a process 600 for fabricating the read head 500 as shown in FIG. 5. Note that specific materials, thicknesses, and processing conditions are provided herein by way of example only and to disclose the presently contemplated preferred mode of implementation. Accordingly, the invention is not to be limited to these specific materials, thicknesses, and processing conditions.

In step 602, the GMR sensor 510 and the side LB stack 530, comprising in this example Al—O(3)/Ni—Cr—Fe(3.2)/Ni—Fe(0.4)/Ir—Mn—Cr(7.5)/Co—Fe(1.8)/Ru(0.4)/Co—Fe(1.6)/Cu—O(1.8)/Co—Fe(1)/Ni—Fe(1.6)/Ru(0.8)/Co—Fe(2)/Ir—M—Cr(5)/Si(6) films, are deposited in a deposition field (e.g., of about 100 Oe) on a wafer coated with a first read-gap layer 506 (e.g., about 8.9 nm thick $Al_2O_3$). In step 604, a first anneal is applied in a high field in a direction perpendicular to the deposition field. An illustrative first anneal is performed at about 10,000-100,000 Oe, preferably about 50,000 Oe, for about 5 hours at about 240° C. In step 606, a second anneal is then applied in a direction antiparallel to the deposition field. An illustrative second anneal is performed in a field of about 500-5,000, preferably about 1,000 Oe, for about 2 hours at about 240° C. in a direction antiparallel to the deposition field. In step 608, a monolayer photoresist is then applied and patterned in a photolithographic tool to mask the GMR sensor 510 and the side LB stacks 530 in the two side regions. Either reactive ion etching or ion milling is applied to remove the Si cap layer and the Ir—M—Cr longitudinal pinning layer of the side LB stack in the exposed read region in step 610. The wafer is then exposed in an oxygen or ozone environment in step 612, where the Co—Fe longitudinal bias layer 532 in the exposed read region is fully oxidized through either natural or plasma oxidation to form a nonmagnetic portion 540. Alternatively, the exposed portion of the Co—Fe longitudinal bias layer 532 can be removed by further milling or reactive ion etching, though natural or plasma oxidation is preferred in order to prevent the sense layers from damage caused by overmilling or overetching.

After removing the monolayer photoresist in step 614, a W conductor layer is selectively formed only on the Si cap layer in the two side regions in step 616. A silicon reduction process is conducted, where the Si cap layer is replaced by the W conductor layer through a chemical reaction: $2WF_6 + 3Si \rightarrow 2W + 3SiF_4$. The conductor layer thus initially functions as a cap. A hydrogen reduction process is then conducted, where the W conductor layer continues to grow to have a thickness of about 60 nm through a chemical reaction: $WF_6 + 3H_2 \rightarrow W + 6HF$. This creates a lead structure integrated with the conductor layer that replaced the Si cap. Bilayer photoresists are applied and patterned in a photolithographic tool to mask the GMR sensor 510 in the read region, and recessed conductor layers comprising for example Ta(3)/Cu(80)/Ta(6) films are deposited into the side regions. Bilayer photoresists with Ta/Cu/Ta overhangs are then lifted off, and a second read-gap layer 508 (e.g., of 14.6 nm thick $Al_2O_3$) is then deposited. After the completion of the read head fabrication processes, the write head fabrication process can commence.

The GMR sensor 510 in the illustrative embodiment requires the first anneal to establish strong antiferromagnetic/ferromagnetic coupling between the transverse pinning layer 514 (e.g., of Ir—Mn—Cr) and the transverse flux-closure structure 516. The net magnetic moment in the transverse flux-closure structure 516 is controlled to be zero to ensure rigid antiparallel coupling. The anneal field must exceed the saturation field ($H_S$) of antiparallel ferromagnetic/ferromagnetic coupling (~24,000 Oe) across the first spacer layer 520 (e.g., of Ru) for aligning the magnetizations of the keeper (e.g., Co—Fe) and reference layers 518, 522 (e.g., both of Co—Fe) in the transverse direction. After cooling to room temperature, the magnetization of the magnetization of the keeper layer 518 is rigidly pinned by the transverse pinning layer 514 in the transverse direction, while the magnetization of the reference layer 522 is rotated by 180°. A transverse flux closure will be formed between the magnetizations of the keeper and reference layers 518, 522 after patterning and lapping, resulting in a small net magnetic moment in the e.g., Co—Fe/Ru/Co—Fe transverse flux-closure structure 516. Since no demagnetizing fields are induced due to the about zero net magnetic moment, as long as the negative ferromagnetic coupling field ($H_F$) counterbalances the current-induced field ($H_1$), the e.g., Co—Fe/Ni—Fe sense layers 526 can be oriented in a longitudinal direction parallel to the ABS. Such a simplified sensor design ensures the GMR sensor will operate properly and optimally.

The side LB stack 530 requires the second anneal to establish strong ferromagnetic/antiferromagnetic coupling between the longitudinal bias structure 526, 528, 532 (e.g., Co—Fe/Ni—Fe/Ru/Co—Fe) and the longitudinal pinning layer 534 (e.g., Ir—Mn—Cr) in the two side regions. The net magnetic moment of the longitudinal bias structure (e.g., Co—Fe/Ni—Fe/Ru/Co—Fe) can be non-zero as long as the antiparallel coupling across the second spacer layer 528 (e.g., Ru) is strong enough to induce needed magnetostatic interactions. The anneal field only needs to exceed the saturation field ($H_S$) of antiparallel coupling across the second Ru spacer layer (~2,000 Oe) for aligning the magnetizations of the e.g., Co—Fe/Ni—Fe sense layers 526 and the e.g., Co—Fe longitudinal bias layer 532 in the longitudinal direction. Since this anneal field is much lower than the saturation field ($H_S$) of antiparallel pinning across the first e.g., Ru spacer layer 520 (~24,000 Oe), the transverse flux closure is not interrupted. After cooling to room temperature, the magnetization of the e.g., Co—Fe longitudinal bias layer 532 is rigidly pinned by the e.g., Ir—Mn—Cr longitudinal pinning layer in the longitudinal direction, while the magnetization of the e.g., Co—Fe/Ni—Fe sense layers 526 is rotated by 180°. Through magnetostatic interactions, the rigidly pinned e.g., Co—Fe/Ni—Fe sense layers 526 in the two side regions will longitudinal bias and thus stabilize the e.g., Co—Fe/Ni—Fe sense layers 526 in the read region.

There are several advantages in the use of the GMR sensor with the side LB stacks, as described herein. First, the transverse pinning layer is formed as a long stripe extended from the read region into the two side regions, instead of as a short stripe confined within the read region. Such a long stripe may provide mechanically and thermally robust antiferromagnetism, due to a large geometry and no ion-milling induced damages at a boundary between the read and side regions. Second, the boundary between the read and side regions is well defined by photolithography only. Without complicated magnetics at abutted junctions formed by ion milling, the read width can be precisely defined, and side reading can be substantially minimized. Third, the GMR sensor is directly connected with low-resistance conductor layers, instead of indirectly connected through two high-parasitic-resistance transition paths. Without the high parasitic resistance which cause substantial heating, the sensor operation can be more thermally stable.

Figure 7:
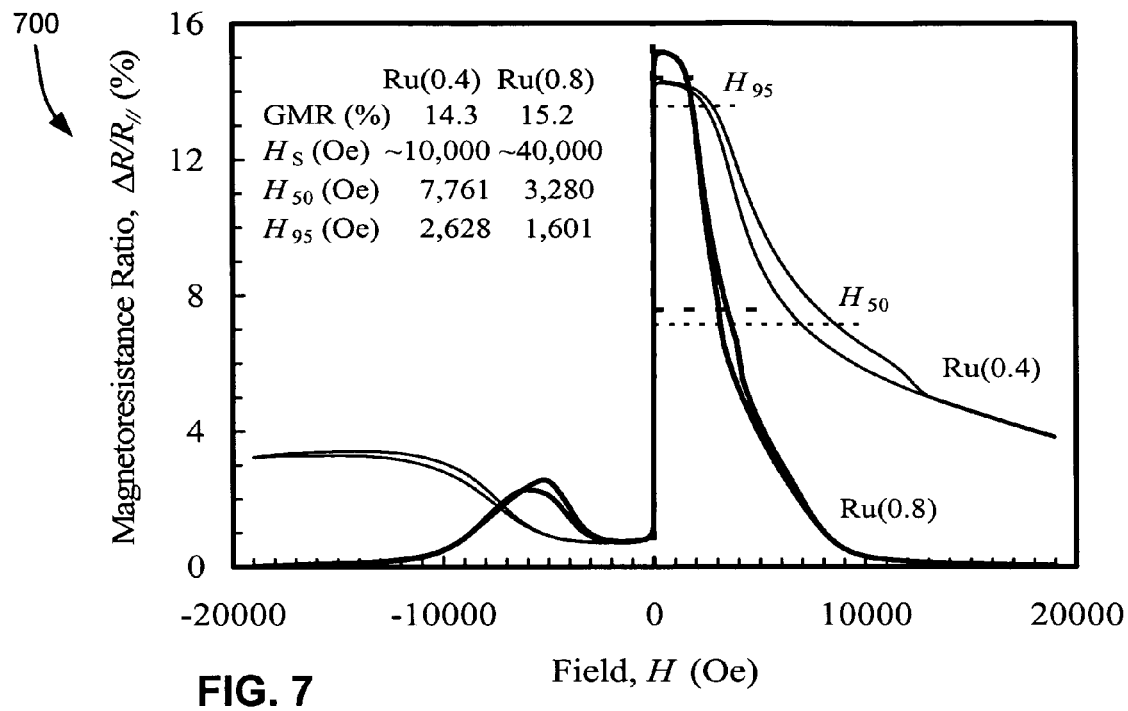
FIG. 7 is a chart illustrating high-field magnetoresistance responses for GMR sensors with 0.4 and 0.8 nm thick Ru spacer layers.
Figure 8:
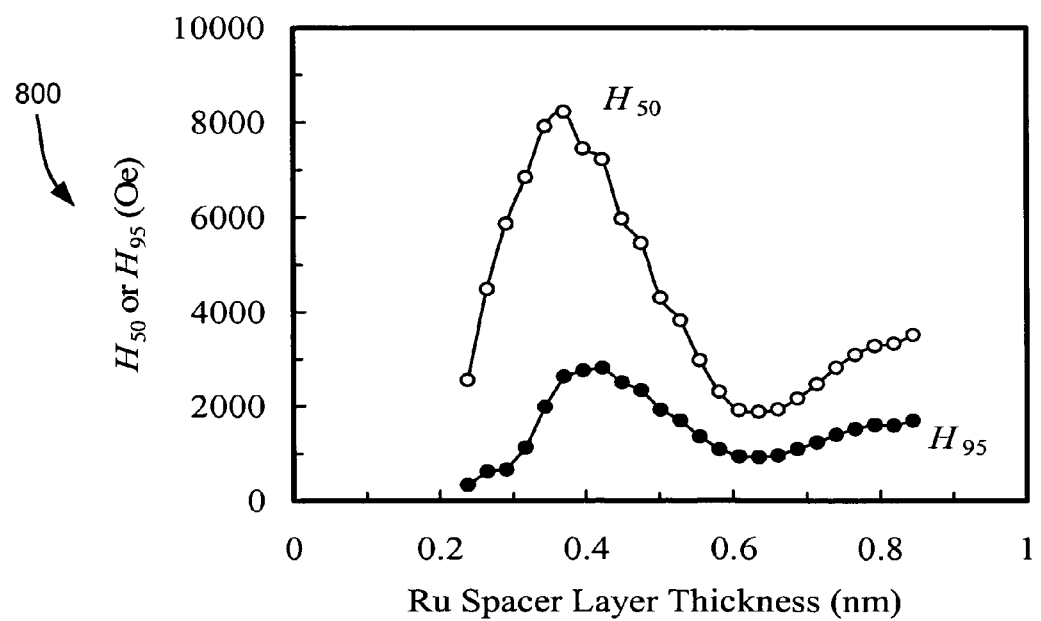
FIG. 8 is a chart illustrating the pinning field vs. the Ru spacer layer thickness.

To ensure the viability of the dual anneal approach in the present invention, it is preferred to ensure that the pinning field of the e.g., Co—Fe/Ru/Co—Fe transverse flux-closure structure 516 in the GMR sensor 510 is much higher than that of the e.g., Co—Fe/Ni—Fe/Ru/Co—Fe longitudinal bias structure. The pinning field of the e.g., Co—Fe/Ru/Co—Fe transverse flux-closure structure 516 in the GMR sensor 510 can be defined as either $H_{50}$ where the GMR coefficient decrease to about 50% of its original value, or $H_{95}$ where the GMR coefficient decreases to about 95% of its original value. As shown in the chart 700 of FIG. 7, as the e.g., Ru spacer layer thickness decreases from about 0.8 to about 0.4 nm, $H_{50}$ substantially increases from about 3,280 to about 7,761 Oe, while $H_{95}$ substantially increases from about 1,601 to about 2,628 Oe. As a result, during the longitudinal anneal in a field of about 1,000 Oe, the e.g., Co—Fe/Ru/Co—Fe transverse flux-closure structure 516 should not be affected. To attain the pinning field as high as possible, the e.g., Ru spacer layer thickness is preferred to be about 0.4 nm. As shown in the chart 800 of FIG. 8, both $H_{50}$ and $H_{95}$ oscillates with the e.g., Cu spacer layer thickness, indicating that the e.g., Ru spacer thickness is preferably selected from a thickness ranging from about 0.3 to about 0.5 nm at the first oscillation peak.

On the other hand, the pinning field of the e.g., Co—Fe/Ni—Fe/Ru/Co—Fe longitudinal bias structure should be just high enough to ensure strong longitudinal bias, preferable around 1,000 Oe. This pinning field in fact can be made to be not very high by utilizing a thicker e.g., Ru second spacer layer 528, a higher total magnetic moment of the e.g., Co—Fe/Ni—Fe/Ru/Co—Fe longitudinal bias structure, and an additional e.g., Ni—Fe longitudinal bias layer in contact with the upper surface of the e.g., Ru second spacer layer.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A magnetic head, comprising:
   a sensor having a sense layer, the sense layer having a read region and side regions flanking the read region;
   a multilayer bias stack formed above or below each of the side regions of the sense layer, the bias stack comprising an antiparallel coupling spacer layer, a ferromagnetic longitudinal bias layer, and an antiferromagnetic longitudinal pinning layer, wherein each of the bias stacks share a common longitudinal bias layer, wherein a portion of the longitudinal bias layer positioned towards the read region is nonmagnetic; and
   the antiparallel coupling spacer layer being positioned between the sense layer and the ferromagnetic longitudinal bias layer of each bias stack,
   wherein the side regions of the sense layer are antiparallel exchange coupled to the bias stacks;
   wherein each bias stack includes a layer of Ir-Mn-Cr.

2. A magnetic head, comprising:
   a sensor having a sense layer, the sense layer having a read region and side regions flanking the read region;

a multilayer bias stack formed above or below each of the side regions of the sense layer, the bias stack comprising an antiparallel coupling spacer layer, a ferromagnetic longitudinal bias layer, and an antiferromagnetic longitudinal pinning layer, wherein each of the bias stacks share a common longitudinal bias layer, wherein a portion of the longitudinal bias layer positioned towards the read region is nonmagnetic; and the antiparallel coupling spacer layer being positioned between the sense layer and the ferromagnetic longitudinal bias layer of each bias stack, wherein the side regions of the sense layer are antiparallel exchange coupled to the bias stacks;

wherein a net magnetic moment of the sense layer and bias stack ferromagnetic films adjacent the antiparallel coupling layer is not zero, wherein the bias stack further comprises a first nonmagnetic conductor layer above the longitudinal pinning layer, and a second nonmagnetic conductor layer formed above the first nonmagnetic conductor layer, wherein both the first nonmagnetic conductor layer and the second nonmagnetic conductor layer are formed of the same material selected from W and Rh.

3. A head as recited in claim 2, wherein each bias stack includes a layer of PtMn.

4. A head as recited in claim 2, wherein the sensor further comprises a first pinning layer extending parallel to the sense layer and along the read and side regions thereof.

5. A head as recited in claim 2, wherein the sensor further comprises an antiparallel pinned layer structure positioned on an opposite side of the sense layer with respect to the bias stacks, wherein a pinning field of the antiparallel pinned layer structure of the sensor is greater than a pinning field of a substructure formed from the sense layer and bias stack ferromagnetic films adjacent the antiparallel coupling layer.

6. A head as recited in claim 2, where the antiparallel coupling layer positioned between the sense layer and the bias stacks is thinner than an antiparallel coupling layer of the antiparallel pinned layer structure of the sensor.

7. A head as recited in claim 2, wherein the portion of the longitudinal bias layer positioned towards the read region is oxidized.

8. A head as recited in claim 2, wherein the portion of the longitudinal bias layer positioned towards the read region has been substantially removed.

9. A head as recited in claim 2, wherein the bias stacks have opposing side edges that have been defined by photolithographic processing.

10. A head as recited in claim 2, wherein the head has been annealed in a direction perpendicular to a deposition field of the sense layer.

11. A head as recited in claim 2, wherein the head has been annealed in a direction antiparallel to a deposition field of the sense layer.

12. A data storage system, comprising:
at least one magnetic medium;
at least one write and read head for reading from and writing to the magnetic medium, wherein each read head has the structure of claim 2;
at least one slider for supporting the write and read head; and
at least one control unit for controlling operation of write and read functions.

13. A head as recited in claim 2, wherein the second nonmagnetic conductor layer is formed directly on the first nonmagnetic conductor layer.

14. A magnetic head, comprising:
a sensor having a sense layer, the sense layer having a read region and side regions flanking the read region;
a multilayer bias stack formed above or below each of the side regions of the sense layer; the bias stack comprising an antiparallel coupling spacer layer, a ferromagnetic longitudinal bias layer, an antiferromagnetic longitudinal pinning layer, a first nonmagnetic conductor layer above the longitudinal pinning layer, and a second nonmagnetic conductor layer formed above the first nonmagnetic conductor layer, wherein each of the bias stacks share a common longitudinal bias layer, wherein a portion of the longitudinal bias layer positioned towards the read region is nonmagnetic; and
an antiparallel coupling layer positioned between the sense layer and each bias stack,
wherein the side regions of the sense layer are antiparallel exchange coupled to the bias stacks,
wherein each bias stack includes a layer of Ir-Mn-Cr.

15. A head as recited in claim 14, wherein a net magnetic moment of the sense layer and bias stack ferromagnetic films adjacent the antiparallel coupling layer is near to zero.

* * * * *